(12) United States Patent
Kang

(10) Patent No.: US 7,145,290 B2
(45) Date of Patent: Dec. 5, 2006

(54) ORGANIC ELECTROLUMINESCENT DEVICES

(75) Inventor: Tae-Wook Kang, Seongnam-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/934,422

(22) Filed: Sep. 7, 2004

(65) Prior Publication Data

US 2005/0116636 A1    Jun. 2, 2005

(30) Foreign Application Priority Data

Nov. 29, 2003    (KR) .................... 10-2003-0086114

(51) Int. Cl.
*H01J 1/62* (2006.01)
*H01J 1/63* (2006.01)
*H01J 63/04* (2006.01)

(52) U.S. Cl. .................. 313/512; 313/504; 313/503; 313/506

(58) Field of Classification Search .............. 313/512
See application file for complete search history.

(56) References Cited

U.S. PATENT DOCUMENTS

| | | | | |
|---|---|---|---|---|
| 5,076,963 | A | * 12/1991 | Kameyama et al. | ... 252/301.36 |
| 6,150,187 | A | * 11/2000 | Zyung et al. | ........... 438/26 |
| 6,717,052 | B1 | * 4/2004 | Wang et al. | ......... 174/52.3 |
| 6,924,594 | B1 | * 8/2005 | Ogura et al. | ........... 313/506 |
| 2002/0155320 | A1 | * 10/2002 | Park et al. | ........... 428/690 |

* cited by examiner

*Primary Examiner*—Mariceli Santiago
*Assistant Examiner*—Elizabeth Rielley
(74) *Attorney, Agent, or Firm*—Robert E. Bushnell, Esq.

(57) ABSTRACT

An organic EL device which has a substrate containing a pixel portion, and a sealing cap covering the substrate, wherein an elastic member is arranged on a surface where the substrate and the sealing cap are contacted with each other. The organic EL device may further include an adhesive on the contacting surface. The organic EL device with the sealing structure effectively prevents external moisture or oxygen from being penetrated, and has the increased lifetime of the device and the decreased failure rate.

12 Claims, 12 Drawing Sheets

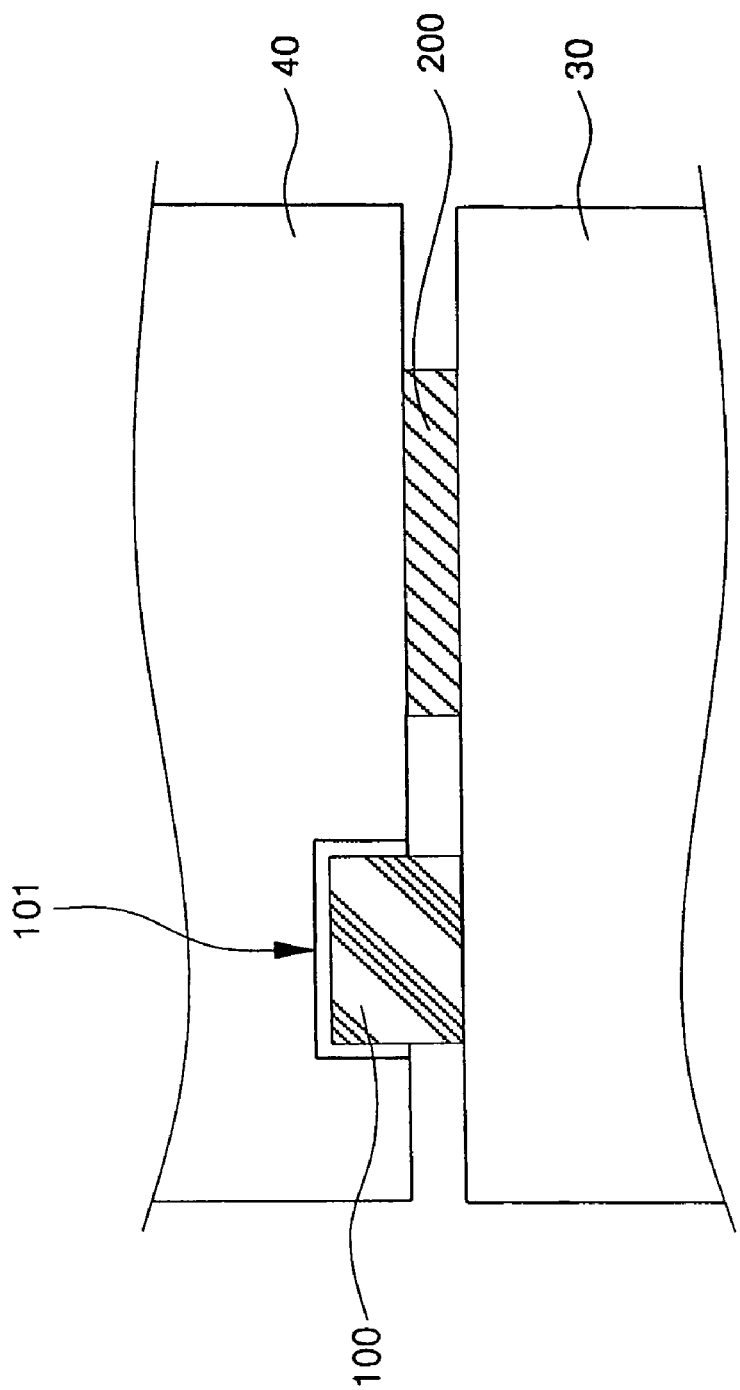

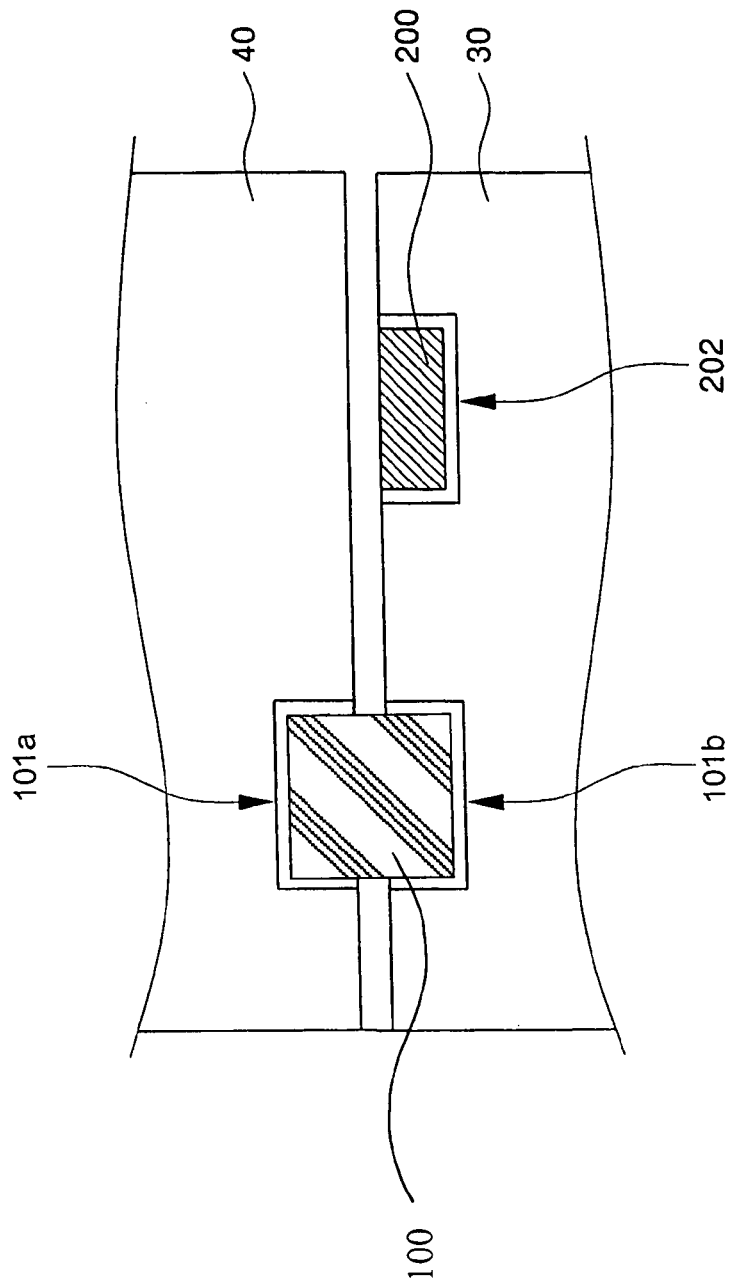

ORGANIC ELECTROLUMINESCENT DEVICES

CLAIM OF PRIORITY

This application claims all the benefit accruing under 35 U.S.C. §119 from Korean Patent Application No. 2003-86114, filed Nov. 29, 2003, in the Korean Intellectual Property Office, the disclosure of which is hereby incorporated herein by reference in its entirety.

BACKGROUND OF THE INVENTION

1. Field of the Invention

The present invention relates to an organic electroluminescent (EL) device, and more particularly, an organic electroluminescent device which has a structure for preventing damage or denaturalization caused by external circumstance such as moisture.

2. Description of the Related Art

In recent years, flat panel displays have been noticed, which overcomes weight and size problems of the cathode ray tube (CRT) to have small size and light weight characteristics. Such flat panel displays include liquid crystal displays (LCD), organic electroluminescent displays (OELD), field emitter displays (FED), plasma display panels (PDP), or the like.

The organic EL device among these displays has advantages such as wider temperature range, higher impact or vibration resistance, wider viewing angle, and faster response time for providing a clear moving picture compared to other flat panel displays, so that it has been noticed as a next-generation flat panel display.

The organic EL device may be classified into a passive matrix type and an active matrix type according to its driving method. The basic structure of the organic EL device includes a substrate 10, a pixel portion 18, which is comprised of a first electrode layer 12 on the substrate 10, an organic layer 14 having at least one emission layer on the first electrode layer 12, a second layer 16 on the organic layer 14, and a passivation layer (not shown) on the second electrode layer 16, as shown in FIG. 1.

The pixel portion 18 formed on the substrate 10 is encapsulated by a sealing cap 20 to prevent its performance and lifetime from being degraded due to external circumstance such as moisture.

The sealing cap 20 is made of metal material to be configured to have an internal space, and is adhered to the substrate 10 by means of adhesive 22 applied along the circumference of the substrate 10.

A moisture absorbent 24 is arranged within the internal space of the sealing cap 20 to prevent luminous efficiency and emission area of the pixel portion 18 from being degraded due to moisture or the like.

In addition, a method for encapsulating the organic EL device with the pixel portion formed on the substrate 10, comprises the step of preparing a sealing cap 20 made of a metal material having a predetermined internal space, and the substrate 10 as shown in FIG. 2.

Next, an adhesive 22 is applied in a thickness of 150 µm along the circumference of the sealing cap 20 in the S4 step.

After the substrate 10 is positioned on the sealing cap 20 and applied with the adhesive 22, a predetermined pressure is applied to the substrate 10 or the sealing cap 20 to reduce the thickness of the adhesive 22 to be about 50 µm, which leads to attach the sealing cap 20 to the substrate 10 in the S6 step. In this case, since the thickness of the adhesive 22 is decreased by the pressure applied to the substrate 10 or the sealing cap 20, the internal space that has been formed by the substrate 10 and the sealing cap 20 becomes reduced, which causes the internal pressure of the internal space to be 1.1 to 3 times the pressure before it is applied to.

The adhesive 22 between the substrate 10 and the sealing cap 20 is subject to ultra violet (UV) curing at a predetermined temperature in the S8 step. In this case, the moisture present within the internal space formed by the substrate 10 and the sealing cap 20 is removed by the moisture absorbent 24, which leads to prevent performance of the pixel portion 18 from being degraded due to the moisture or the like.

However, in the organic EL device having the above-mentioned structure, some of the adhesive applied on the substrate is come off or the width of the applied adhesive is decreased, and curing defects occur due to the thickness difference of the adhesive, which results in moisture infiltration into the defective portion of the adhesive to thereby deteriorate the organic EL device.

To solve the above-mentioned problems, there has been an attempt to have a sealing groove for accommodating the adhesive to be applied on the substrate 10 or the sealing cap 20. As a result, the thickness of the adhesive to be applied becomes constant and the adhesive strength is increased to thereby reduce the adhesive defects to some extent.

However, when the UV curing is performed for the adhesive, UV is blocked by the metal wiring of the substrate so that sufficient amount of UV is not irradiated to the adhesive, which causes the insufficient hardness of the adhesive. In addition, the remaining gas is emitted after the curing is performed, and causes the adhesive strength to be degraded as time goes. Due to these defects, impurity, oxygen, or moisture is penetrated from external to cause the moisture absorbent function to be degraded, which still causes the lifetime of the organic EL device to be shortened.

SUMMARY OF THE INVENTION

It is, therefore, an object of the present invention to provide an improved organic EL device.

It is also an object of the present invention to provide an organic EL device capable of effectively preventing gas resulted from a sealing member and external impurities from being penetrated.

It is a further object of the present invention to provide an organic EL device which can prevent damage or denaturalization caused by external circumstance such as moisture.

It is another object of the present invention to provide an organic EL device having the increased lifetime.

It is yet another object of the present invention to provide an organic EL device having the increased lifetime of the moisture absorbent within the device.

The above and other objects may be achieved with an organic electroluminescent device having a substrate, a pixel portion formed on the substrate, a sealing cap covering at least the pixel portion, wherein an elastic member is arranged on a surface where the substrate and the sealing cap are contacted with each other to hermetically seal at least the pixel portion.

The organic electroluminescent device may be a passive matrix type or an active matrix type.

The elastic member may be positioned on a surface of the contacting part between the substrate and the sealing cap, or in a first groove formed on at least one of the substrate and the sealing cap.

An adhesive may be applied on a surface where the substrate and the sealing cap are contacted with each other.

Alternatively, the adhesive may be positioned in a second groove formed on at least one of the substrate and the sealing cap.

It is preferred that the elastic member and the adhesive are arranged to be spaced apart from each other along a circumferential surface of the sealing cap. The elastic member may be positioned inwardly or outwardly with respect to the adhesive.

It is preferred that the elastic member is natural or synthetic rubber, and the adhesive is at least one of thermosetting and UV curing adhesives.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 7 to FIG. 9 are enlarged cross-sectional views of other embodiments of the "A" region of FIG. 3.

DETAILED DESCRIPTION OF THE PREFERRED EMBODIMENTS

Figure 1:
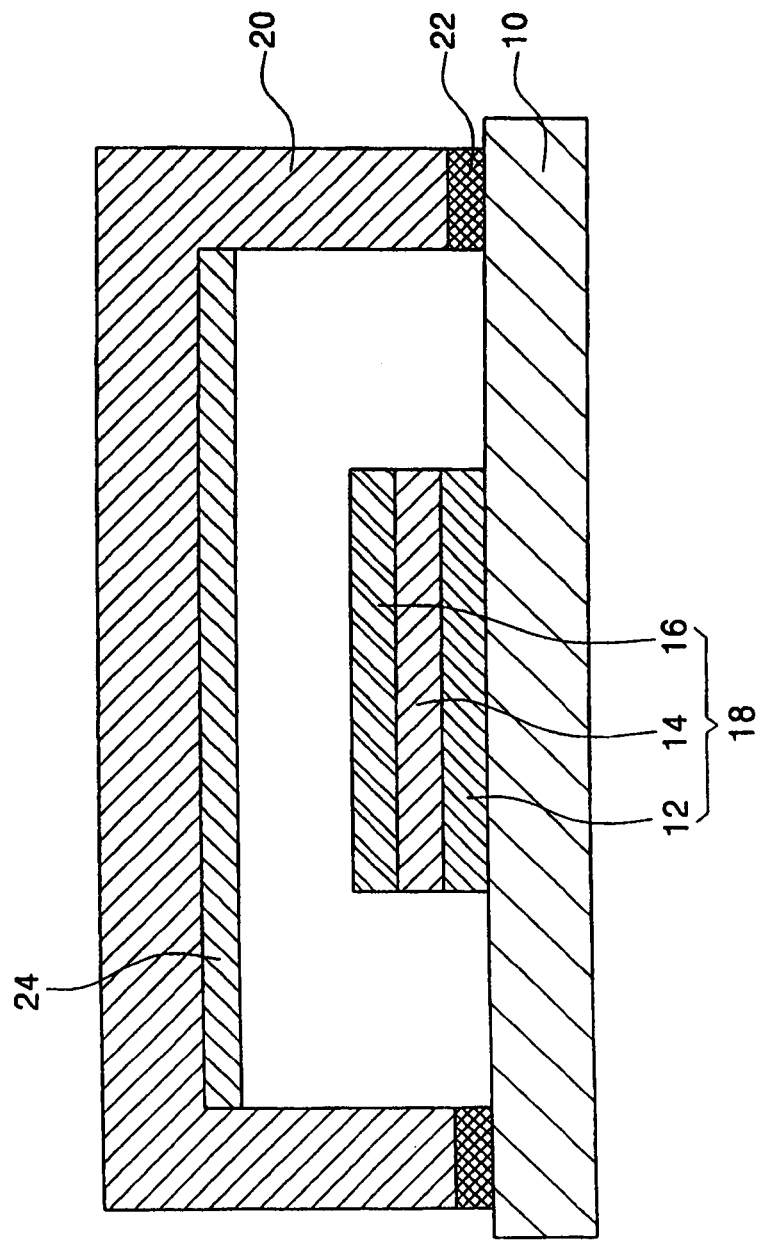
FIG. 1 is a schematic cross-sectional view of a conventional organic EL device; as exemplified in Ebisawa et al U.S. Pat. No. 6,284,342 (described at column 3 lines 60 through column 4 line 14 of that patent)
Figure 2:
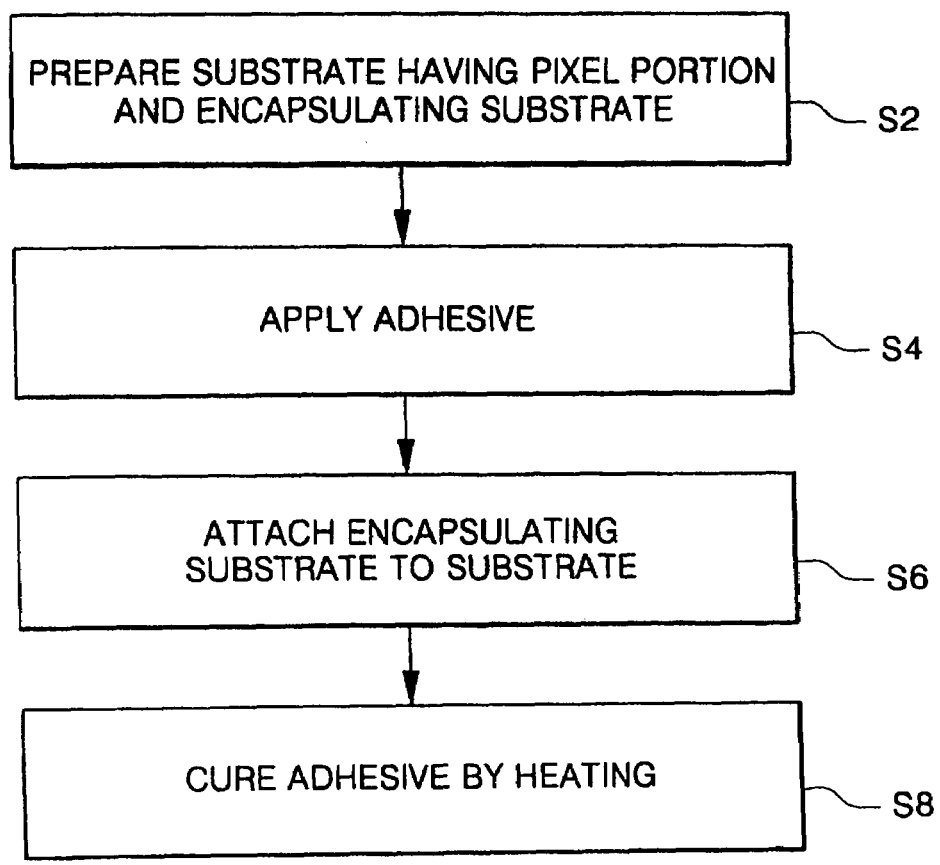
FIG. 2 is a flow chart for explaining a method for encapsulating a conventional organic EL device; as exemplified in Ebisawa et al U.S. Pat. No. 6,284,342 (described at column 5 lines 6–42 of that patent)

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, thickness, length or the like of layers and regions are exaggerated for clarity. Like numbers refer to like elements throughout the specification.

Figure 3:
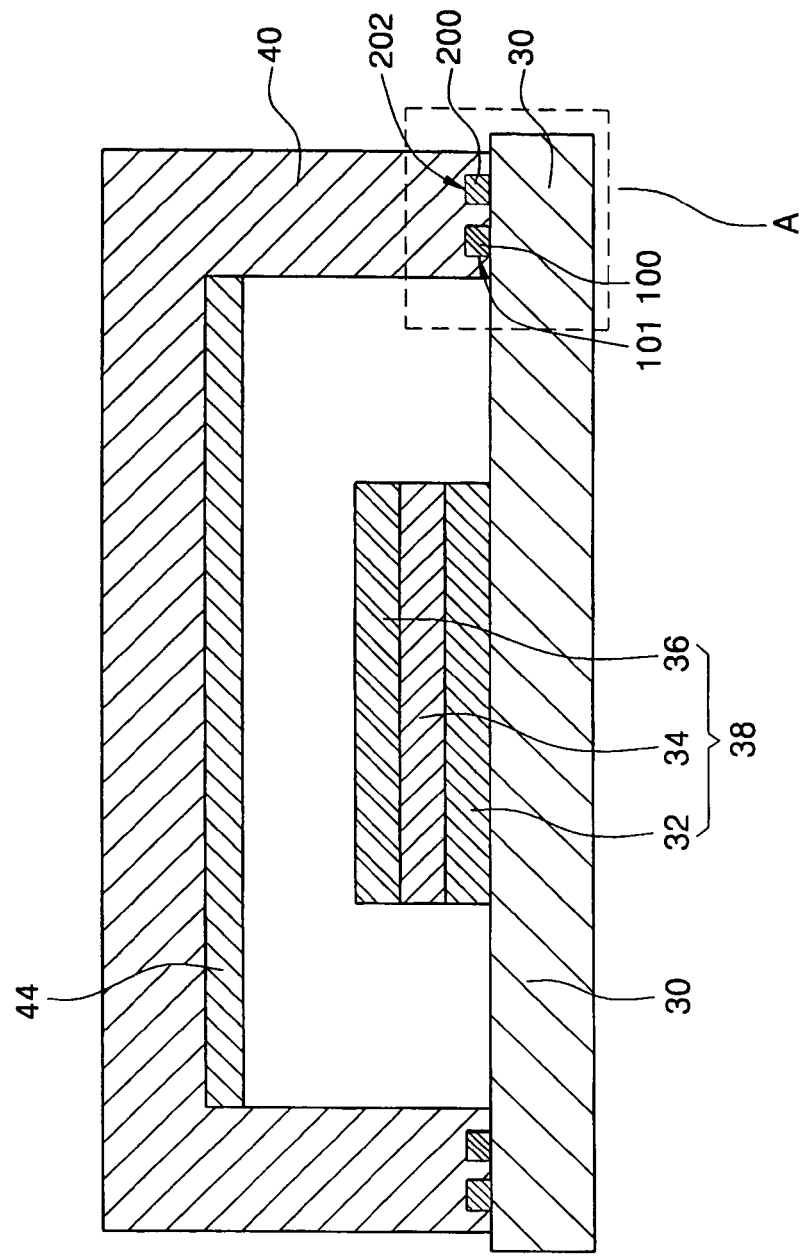
FIG. 3 is a cross-sectional view for explaining a configuration of an organic EL device in accordance with one embodiment of the present invention.

FIG. 3 is a cross-sectional view for explaining a configuration of an organic EL device in accordance with one embodiment of the present invention.

Referring to FIG. 3, a first electrode layer 32, an organic layer 34 including at least one emission layer, and a second electrode layer 36 are sequentially formed on a substrate 30 to thereby form an organic EL device. A sealing cap 40 is pressed at a predetermined pressure to seal the pixel portion. Glass, plastic or metal flat panel or cap may be used for material of the substrate 30 or the sealing cap 40, and the glass is preferably used for the substrate 30.

In FIG. 3, the organic EL device in accordance with one embodiment of the present invention has an elastic member 100 with a superior sealing effect. The sealing cap 40 has a first groove 101 for accommodating the elastic member 100. The first groove 101 for accommodating the elastic member may be formed in any one or both of the substrate 30 and the sealing cap 40.

The organic EL device may further include an adhesive 200. The adhesive 200 may be positioned on the surface where the substrate 30 and the sealing cap 40 are to be contacted with each other, or may be arranged in a second groove 202 for accommodating the adhesive 200. The second groove 202 for accommodating the adhesive 200 is arranged in any one or both of the substrate 30 and the sealing cap 40. In FIG. 3, the adhesive is accommodated in a second groove 202 formed on the sealing cap 40.

Figure 4A:
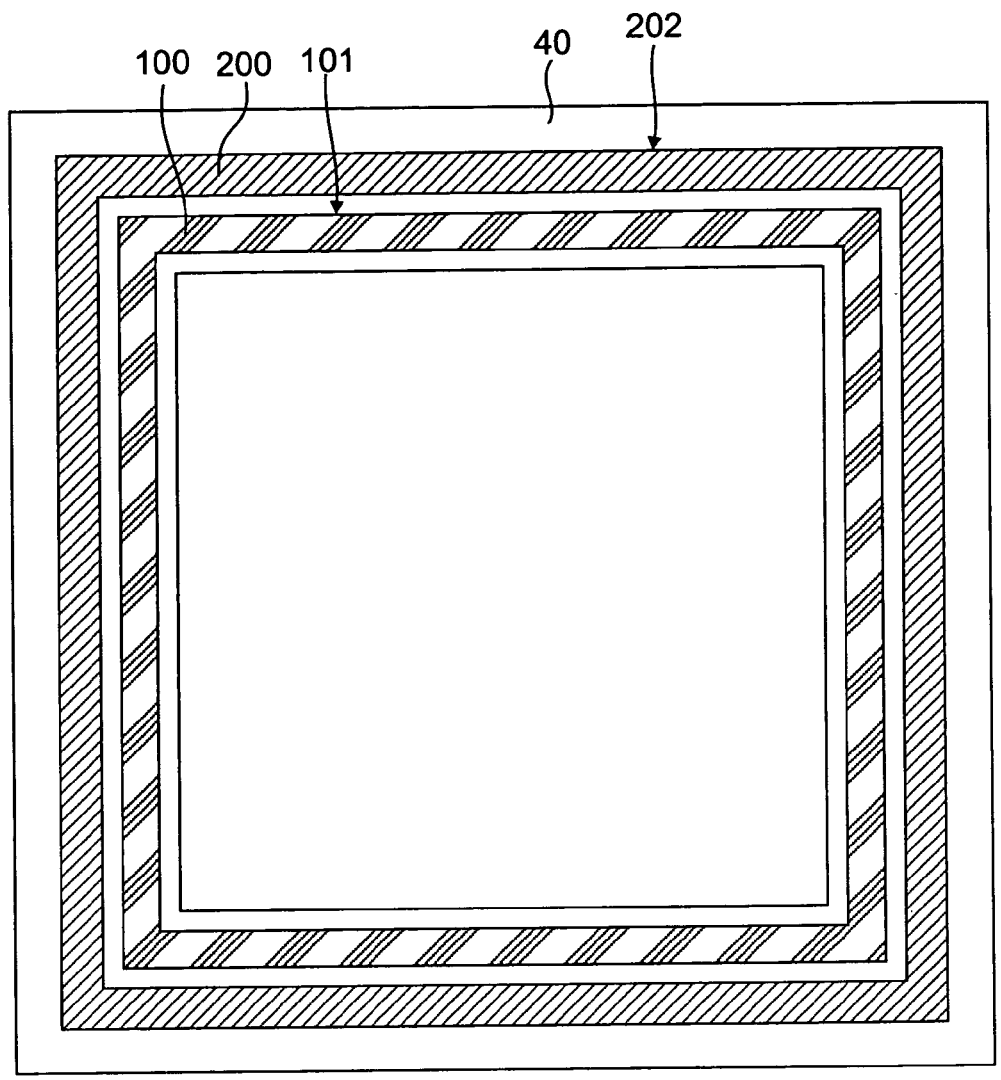
FIGS. 4A and 4B are top views of the arrangements of the elastic member and the adhesive in the organic EL device according to the preferred embodiments of the present invention.
Figure 4B:
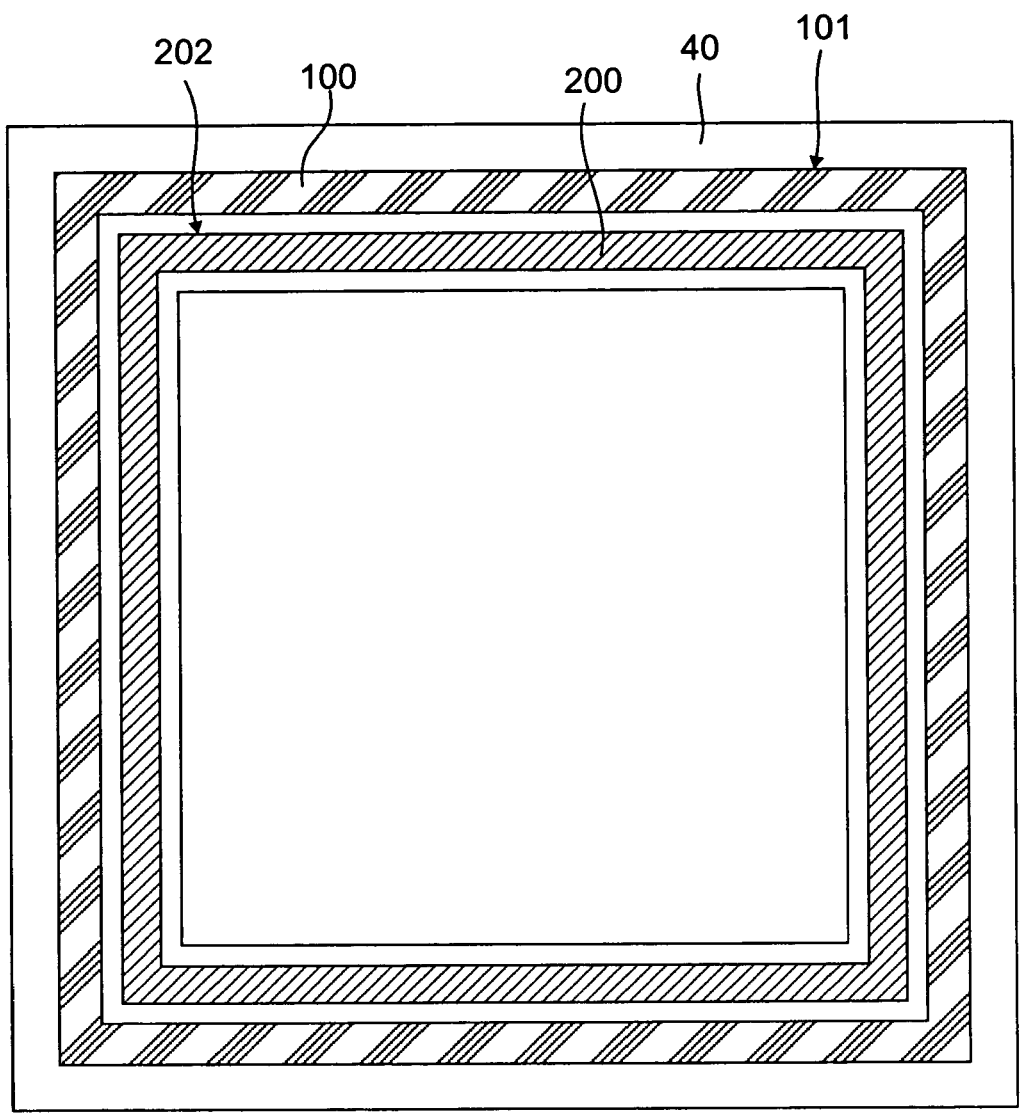

Referring to FIGS. 4A and 4B, FIGS. 4A and 4B are top views of the arrangements of the sealing materials of the elastic member 100 and the adhesive 200. As shown in FIGS. 4A and 4B, the elastic member 100 may be positioned inwardly (as shown in FIG. 4A) or outwardly (as shown in FIG. 4B) with respect to the adhesive 200.

Figure 5A:
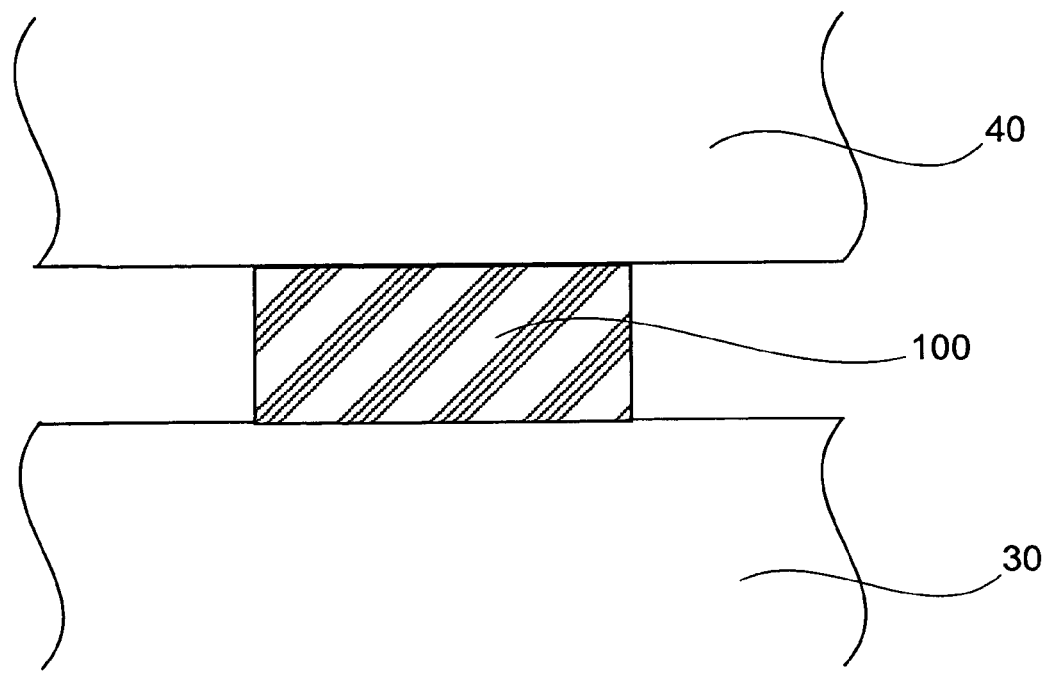
FIGS. 5A to 5D are enlarged cross-sectional views of the positions of the elastic member.
Figure 5B:
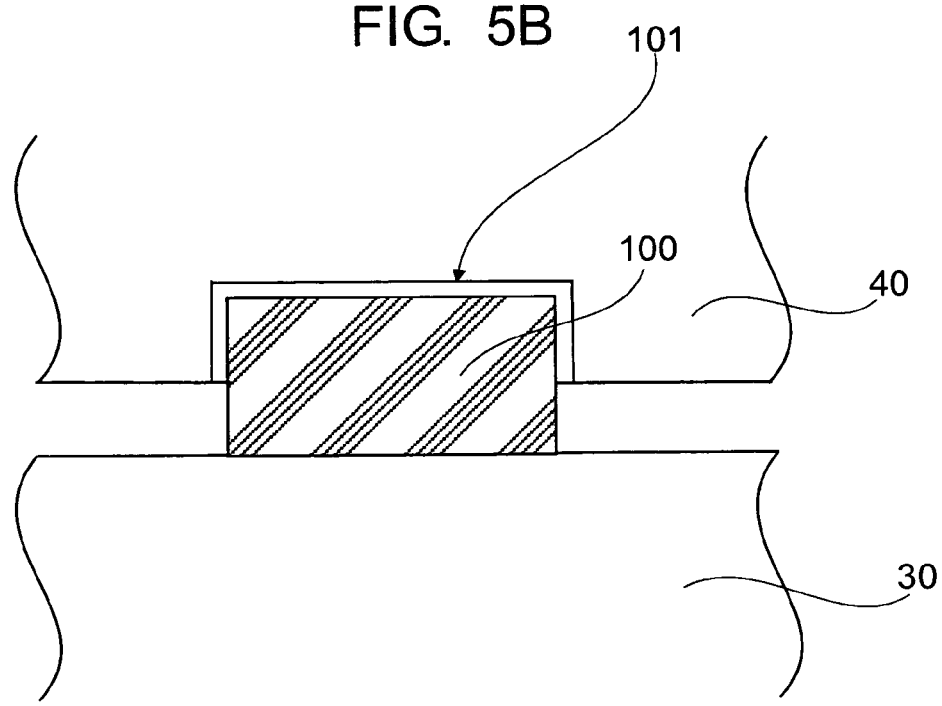
Figure 5C:
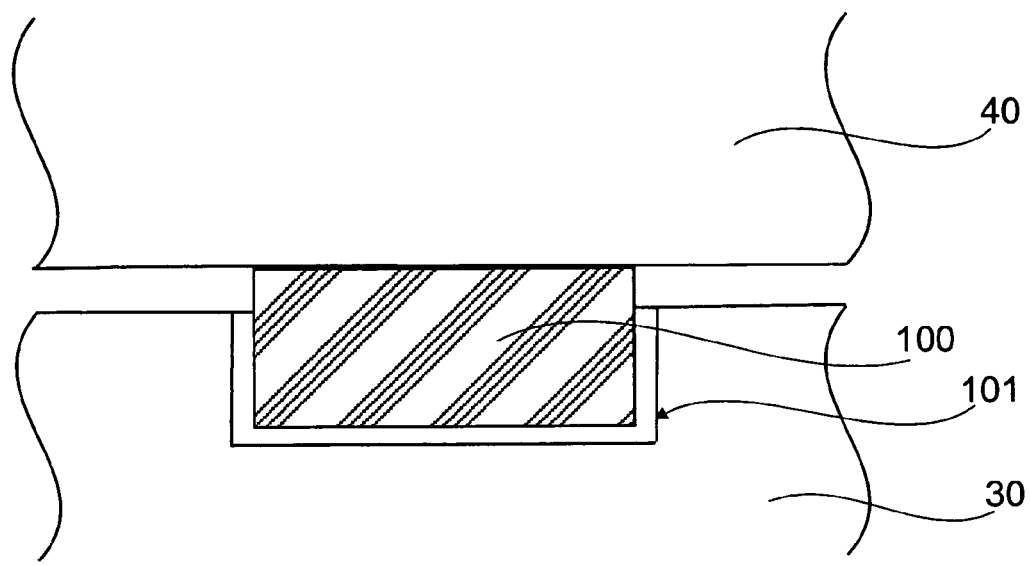
Figure 5D:
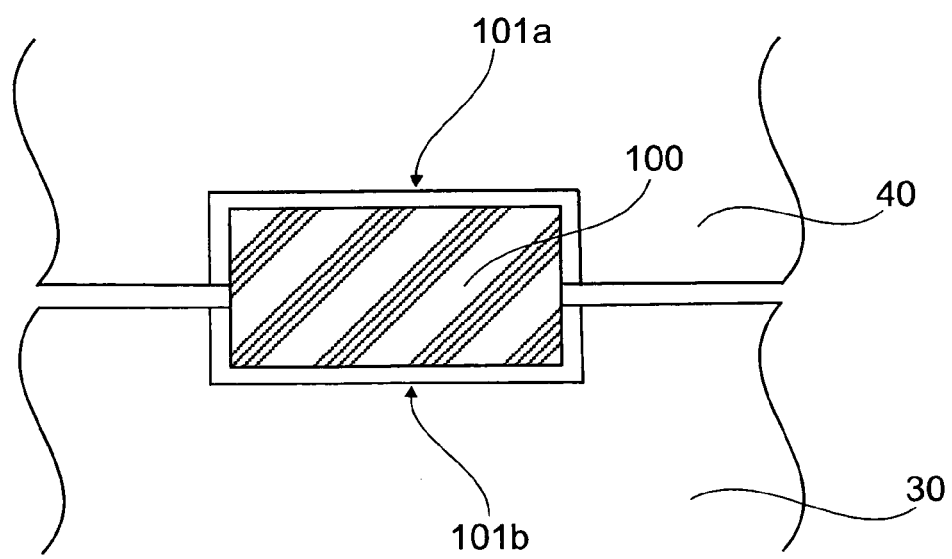
Figure 6A:
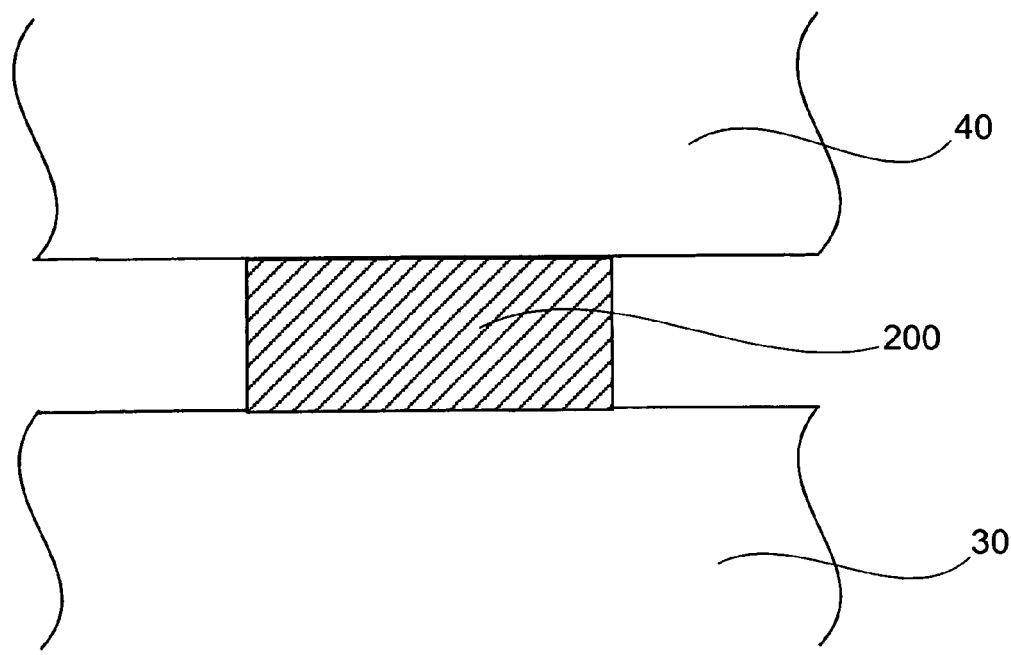
FIGS. 6A to 6D are enlarged cross-sectional views of the positions of the adhesive.
Figure 6B:
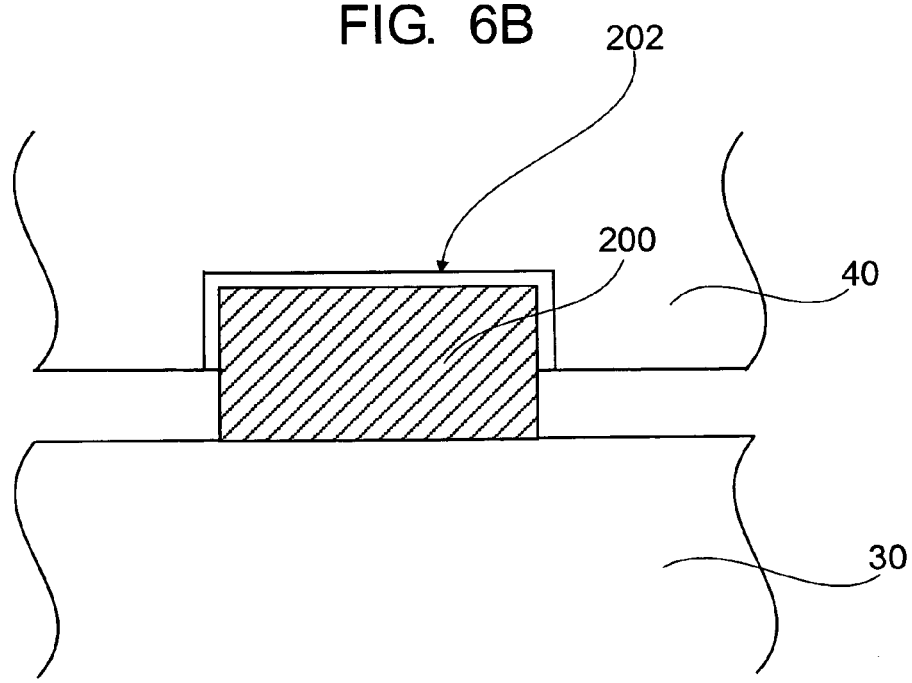
Figure 6C:
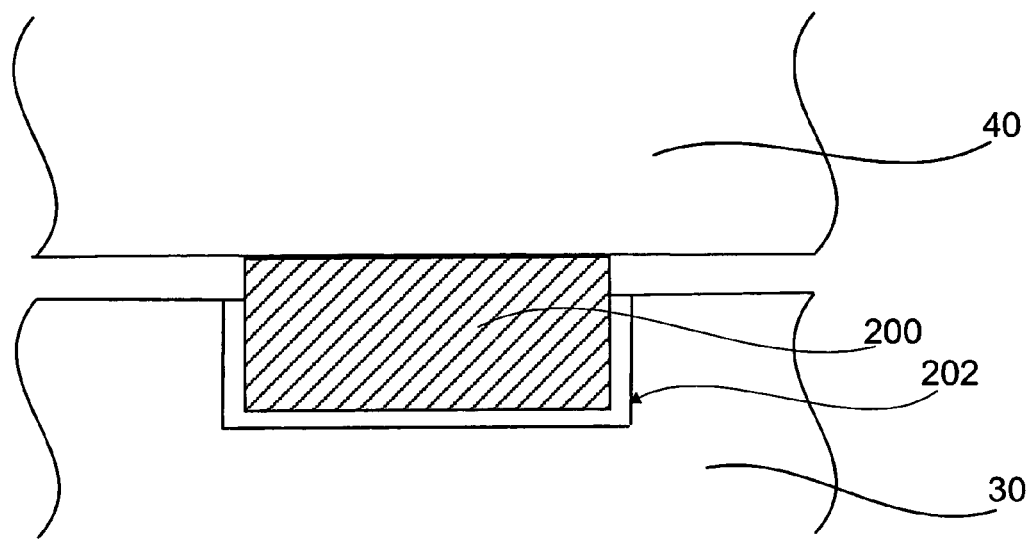
Figure 6D:
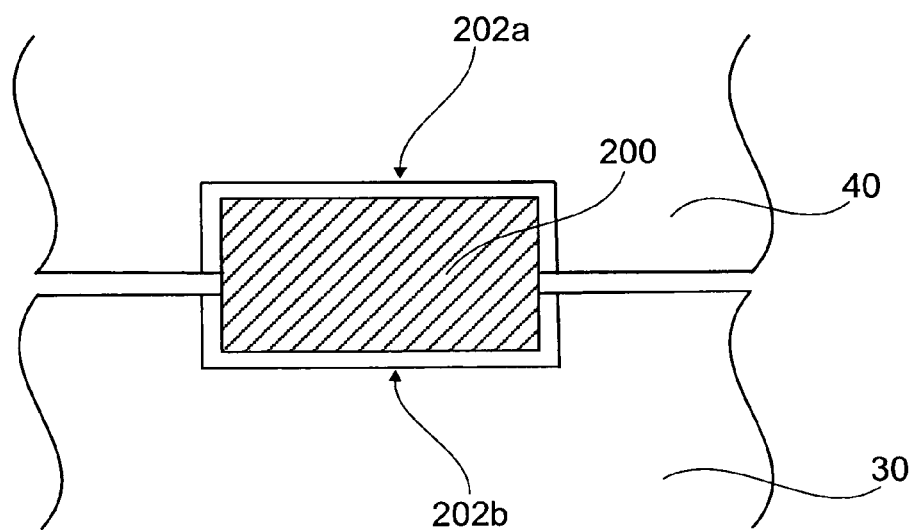

FIGS. 5A to 5D and 6A to 6D show enlarged cross-sectional views of the various positions of the elastic member 100 and the adhesive 200, respectively. FIGS. 5A and 6A show that the elastic member 100 or the adhesive 200 is positioned on the surface of the contacting part. FIGS. 5B and 6B show that the elastic member 100 or the adhesive 200 is positioned on the groove (101 or 202) formed on the sealing cap 40. FIGS. 5C and 6C show that the elastic member 100 or the adhesive 200 is positioned on the groove (101 or 202) formed on the substrate 30. FIGS. 5D and 6D show that the elastic member 100 or the adhesive 200 is positioned on the grooves (101a and 101b, or 202a and 202b) formed on the substrate 30 and the sealing cap 40. Various combinations of the elastic member position and the adhesive position are possible. Some of the embodiments are described hereinbelow referring to FIGS. 7 to 9.

Figure 7:
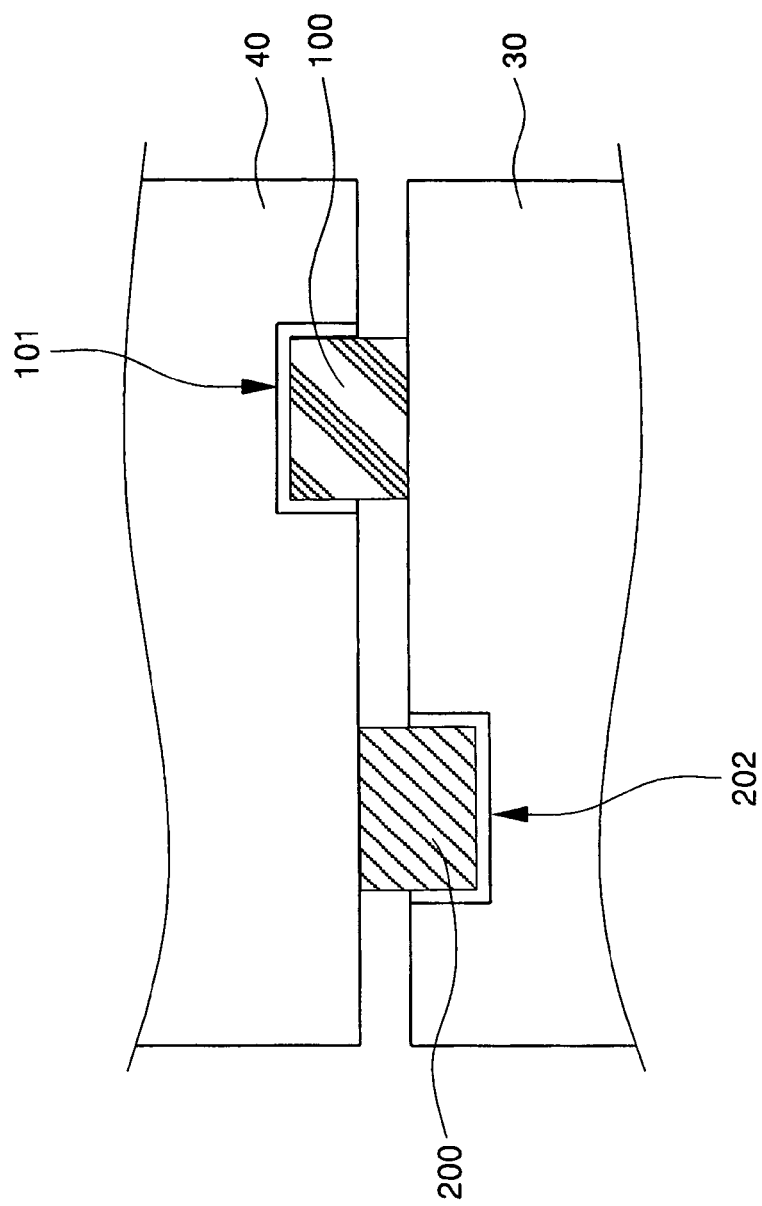

FIG. 7 to FIG. 9 show enlarged cross-sectional views of "A" region of FIG. 3 in accordance with other embodiments of the present invention. Referring to FIG. 7 to FIG. 9, various positions of the elastic member 100 and the adhesive 200 are shown.

Referring to FIG. 7, the first groove 101 is formed on the sealing cap 40, and the second groove 202 is formed on the substrate 30, respectively. In this case, the elastic member 100 is positioned in the first groove 101, and the adhesive 200 is accommodated in the second groove 202 as shown in FIG. 7. Alternatively, both the first groove 101 and the second groove 202 may be formed on either the substrate 30 or the sealing cap 40 (as shown in FIG. 3). Also, as shown in FIGS. 4A and 4B, the alternative arrangements are possible. That is, the elastic member 100 may be positioned inside (as shown in FIG. 4A) or outside (as shown in FIG. 4B) with respect to the adhesive 200.

Referring to FIG. 8, the first groove 101 is formed on the sealing cap 40, and the elastic member 100 is positioned in the first groove 101. The adhesive 200 is applied onto the substrate 30 and/or the sealing cap 40. Alternatively, the first groove 101 may be formed on the substrate 30 instead of the sealing cap 40. Also, as shown in FIGS. 4A and 4B, the alternative arrangements are possible. That is, the elastic member 100 may be positioned inside (as shown in FIG. 4A) or outside (as shown in FIG. 4B) with respect to the adhesive 200.

Referring to FIG. 9, the first groove includes two grooves 101a and 101b which are formed on the sealing cap 40 and the substrate 30, respectively. The elastic member 100 is positioned between the two grooves 101a and 101b. The second groove 202 is formed on the substrate 30.

Alternatively, the adhesive 200 may be applied to the surface where the substrate 30 and the sealing cap 40 are contacted with each other, or the second groove 202 formed on the sealing cap 40 or both of the substrate 30 and the sealing cap 40 as the grooves 101a and 101b for the elastic member. Also, as shown in FIGS. 4A and 4B, the alternative arrangements are possible. That is, the elastic member 100 may be positioned inside (as shown in FIG. 4A) or outside (as shown in FIG. 4B) with respect to the adhesive 200.

The elastic member 100 used in the present invention is positioned between the substrate 30 and the sealing cap 40 to be contacted with each other by pressure, which allows it to have a superior sealing characteristic resulted from its specific repulsion elasticity. Typically, a well known O-ring material may be employed for the elastic member 100. For example, natural rubber and synthetic rubber or the like may be employed for the same.

By way of examples, acrylonitrile-butadiene rubber (NBR) such as Chemigum™, Hycar™, Krynac™, and Paraci™, hydrogenated nitrile rubber (HNBR) such as Therban™, Tornac™, and Zetpol™, fluorinated rubber such as Viton™, Fluorel™, Dyneon™, and Technoflon™, perfluoroelastomer such as Kalrez™, Perlast™, and Aegis™, tetrafluorethylene propylene copolymer such as Aflas™, ethylene propylene diene (EPDM) such as Nordel™, Royalene™, and Vistalon™, styrene butadiene rubber (SBR) such as Ameripol™ Synpol™, Plioflex™, and Stereon™, chloroprene, neoprene such as Baypren™, and Butaclor™, butyl rubber, isobutylene isoprene, methyl phenyl silicone, methyl phenyl vinyl silicone, methyl vinyl silicone such as Rhodorsil™, Silastic™, and SILPLUS™, fluorosilicone (FSE) such as Silastic™, and Sylon™, polyacrylate ethylene acrylic such as Vamac™, chlorosulfonated polyethylene (CSM) such as Hypalon™, chloropolyethylene such as Tyrin™, epichlorohydrin copolymer (ECO) such as Gechron™, and Hydrin™, polyisoprene-natural (NR) such as SMR™, Pale Crepe™, and Smoked Sheet™, polyisoprene rubber such as Ameripol™, SN™, NatSyn™, and Nipol™, polyester-urethane rubber, polyether-urethane rubber such as Adiprene™, Millathane™, and Vibrathane™, polybutadiene rubber such as Ameripol CB™, Budene™, and Taktene™ may be employed.

The natural rubber and the synthetic rubber have superior low and high temperature properties, and also have superior properties of elasticity, water resistance, wear resistance, and repulsion elasticity, so that it is preferably used as a sealing material. Furthermore, it has a less gas leak rate and a superior sealing property compared to the conventional adhesive so that it may effectively prevent external impurities from being penetrated.

In particular, the elastic member 100 of the present invention is preferably subject to a baking process before it is applied to the substrate 30 or the sealing cap 40 in order to reduce the gas occurred from the elastic member 100.

In this case, the shape of the elastic member 100 to be applied may be properly selected based on the shape of the groove formed on the substrate 30 and/or the sealing cap 40. Circular, elliptical, rectangular, or semicircular shape capable of maintaining the sealing property is typically used, but not limited thereto. In particular, since the elastic member 100 may be twisted with the increasing pressure, or may compress one of the contact surfaces, or may torn apart or moved to a gap between the groove 101 and the elastic member 100, it is important to select the proper material.

In addition to the elastic member 100, the present invention also uses the adhesive 200 for increasing the adhesive strength between the substrate 30 and the sealing cap 40. As mentioned above, the adhesive 200 may be applied on the substrate 30 and/or the sealing cap 40 in the region where the sealing cap 40 is contacted with the sealing cap 40, or may be positioned within the second groove 202 formed at least one of the substrate 30 and the sealing cap 40.

Preferably, material capable of being thermoset or UV cured is used as the adhesive 200. UV curing adhesive is preferably used. The UV curing adhesive may include polyimides resin, polyamides resin, polyacrylates resin, epoxy resin, polyurethanes resin, silicone, ethylene vinylacetate (EVA) resin, or the like.

The elastic member 100 and the adhesive 200 are used to encapsulate the substrate 30 in the present invention, which results in a double sealing effect, so that the substrate 30 with the pixel portion 38 is completely encapsulated from outside, which allows to completely prevent impurity, oxygen, moisture or the like from being penetrated into the organic light emitting device formed on the substrate 30.

In the meantime, the organic EL device has the moisture absorbent 44 formed on the inner upper surface of the sealing cap 40 to effectively remove the moisture present in the internal space formed by the adhesion between the substrate 30 and the sealing cap 40. As is well known in the art, the moisture present inside of the organic EL device causes metal corrosion used as an electrode material, and causes the organic layer 34 to be degenerated, which results in the decrease of the luminous efficiency and the decrease of the emission area in the organic EL device. As such, maintenance of the absorbing property of the moisture absorbent is closely related to the device characteristics and lifetime of the organic EL device.

In the present invention, the elastic member 100 and the adhesive 200 are further formed on the contact surface where the substrate 30 with the pixel portion 38 and the sealing cap 40 are contacted with each other, which allows to prevent the external moisture from being penetrated and to increase the lifetime of the absorbent 44. As a result, the device characteristics of the organic EL device may be maintained and its lifetime may be increased.

The organic EL device in accordance with the present invention may be properly applied to a passive matrix type organic EL display without thin film transistors, or to an active matrix organic EL display integrated with the thin film transistor as a single unit.

The basic structure of the active matrix organic EL display comprises a substrate 30, a semiconductor layer formed on the substrate 30, a thin film transistor (TFT; not shown) having gate, source/drain regions and source/drain electrodes, a first electrode layer 32 contacted with the source/drain electrodes of the thin film transistor on the substrate 30, an organic layer 34 having at least one emission layer formed above the first electrode layer 32, an organic light emitting device having a second electrode layer 36 formed over an entire surface of the substrate 30, and a sealing cap 40 facing to the substrate 30, wherein the elastic member 100 is formed on the surface where the substrate 30 and the sealing cap 40 are contacted with each other.

Material, position or the like for the elastic member 100 and the adhesive 200 follows the above description.

As a result, the organic EL display may effectively prevent external impurity, oxygen, or moisture from being penetrated, so that the device characteristics of the organic EL device are maintained and its lifetime is increased.

As mentioned above, in accordance with the present invention, when the substrate having the pixel portion is encapsulated by the sealing cap, the elastic member with a superior sealing property is positioned on the surface where the substrate and the sealing cap are contacted with each other, and the adhesive is further formed in a position spaced from the elastic member, so that the impurity, oxygen, moisture or the like penetrated into the organic EL device may be completely blocked.

In addition, the elastic member to be used is preprocessed, so that potential gas to be leaked from the elastic member may be effectively controlled.

To sum up, the elastic member and the adhesive are formed between the substrate and the sealing cap in accordance with the present invention, so that the lifetime of the organic EL display may be increased.

While the present invention has been described with reference to a particular embodiment, it is understood that the disclosure has been made for the purpose of illustrating the invention by way of examples and is not limited to limit the scope of the invention. And one skilled in the art can amend and change the present invention without departing from the scope and spirit of the invention.

What is claimed is:

1. An organic electroluminescent device, comprising:
   a substrate;
   a pixel portion formed on the substrate;
   a sealing cap covering at least said pixel portion formed on the substrate;
   an elastic member spaced apart from the pixel portion and arranged between the substrate and the sealing cap to hermetically seal at least said pixel portion, the elastic member positioned in a first groove formed on at least one of the substrate and the sealing cap; and
   an adhesive on the surface where the substrate and the sealing cap are contacted with each other, the adhesive positioned in a second groove formed on at least one of the substrate and the sealing cap, the elastic member and the adhesive arranged to be spaced apart from each other along a circumferential surface of the sealing cap.

2. The organic electroluminescent device as claimed in claim 1, wherein said pixel portion comprises:
   a first electrode layer formed on the substrate;
   an organic layer including at least one emission layer formed on the first electrode layer; and
   an organic light emitting device including a second electrode layer formed over the substrate.

3. The organic electroluminescent device as claimed in claim 1, wherein said first groove comprises two grooves one of which is formed on the substrate and the other of which is formed on the sealing cap, and each formed on a position corresponding to each other.

4. The organic electroluminescent device as claimed in claim 1, wherein said second groove comprises two grooves one of which is formed on the substrate and the other of which is formed on the sealing cap, and each formed on a position corresponding to each other.

5. The organic electroluminescent device as claimed in claim 1, wherein the elastic member is positioned inside or outside with respect to the adhesive.

6. The organic electroluminescent device as claimed in claim 1, wherein the elastic member is rubber.

7. The organic electroluminescent device as claimed in claim 6, wherein the rubber is selected from the group consisting of acrylonitrile-butadiene rubber (NBR), hydrogenated nitrile rubber (HNBR), fluorinated rubber, perfluoroelastomer, tetrafluoroethylene propylene copolymer, ethylene propylene diene (EPDM), styrene butadiene rubber (SBR), chloroprene, neoprene, butyl rubber, isobutylene isoprene, methyl phenyl silicone, methyl phenyl vinyl silicone, methyl vinyl silicone, fluorosilicone (FSE), polyacrylate ethylene acrylic, chlorosulfonated polyethylene (CSM), chloropolyethylene, epichlorohydrrn copolymer (ECO), polyisoprene-natural rubber, polyisoprene rubber, polyester-urethane rubber, polyether-urethane rubber, and polybutadiene.

8. The organic electroluminescent device as claimed in claim 1, wherein the adhesive is at least one of thermosetting adhesive and UV curing adhesive.

9. The organic electroluminescent device as claimed in claim 1, wherein the adhesive is at least one of thermosetting adhesive and UV curing adhesive which is selected from the group consisting of polyimides resin, polyamides resin, polyacrylates resin, epoxy resin, polyurethanes resin, silicone, and ethylene vinylacetate (EVA) resin.

10. The organic electroluminescent device as claimed in claim 1, wherein said pixel portion comprises:
    a thin film transistor having a semiconductor layer, a gate, source/drain regions, and source/drain electrodes formed on the substrate;
    a first electrode layer contacted with the source/drain electrodes of the thin film transistor on the substrate;
    an organic layer having at least one emission layer formed above the first electrode layer; and
    an organic light emitting device including a second electrode layer formed over an entire surface of the substrate.

11. The organic electroluminescent device as claimed in claim 1, further comprising a moisture absorbent within a sealed space made by said sealing cap and said substrate.

12. An organic electroluminescent device, comprising:
    a substrate;
    a pixel matrix formed on the substrate;
    a sealing cap covering said substrate to make an internal space accommodating said pixel matrix;
    a sealing material applied to hermetically seal said internal space, said sealing material comprising an elastic member and an adhesive, the elastic member and the adhesive arranged to be spaced apart from each other along a circumferential surface of the sealing cap, the elastic member positioned on one of the surface of the contacting part and a first groove formed on at least one of the substrate and the sealing cap, the adhesive positioned on one of the surface of the contacting part and a second groove formed on at least one of the substrate and the sealing cap; and
    a moisture absorbent within the internal space.

* * * * *